United States Patent [19]
Nagamatsu et al.

[11] Patent Number: 5,629,537
[45] Date of Patent: May 13, 1997

[54] SEMICONDUCTOR DEVICE

[75] Inventors: Tetsu Nagamatsu, Kawasaki; Hiroshi Momose, Tokyo, both of Japan

[73] Assignee: Kabushiki Kaisha Toshiba, Kawasaki, Japan

[21] Appl. No.: 346,829

[22] Filed: Nov. 30, 1994

Related U.S. Application Data

[63] Continuation of Ser. No. 989,905, Dec. 11, 1992, abandoned, which is a continuation of Ser. No. 729,559, Jul. 15, 1991, abandoned.

[30] Foreign Application Priority Data

Jul. 19, 1990 [JP] Japan ................. 2-189462

[51] Int. Cl.⁶ ..................................... H01L 27/10
[52] U.S. Cl. ............................. 257/205; 257/378
[58] Field of Search ......................... 357/42, 43, 45; 257/205, 378

[56] References Cited

U.S. PATENT DOCUMENTS

| | | | |
|---|---|---|---|
| 4,884,115 | 11/1989 | Michel et al. | 357/42 |
| 4,920,164 | 4/1990 | Tanizawa | 357/42 |
| 5,049,967 | 9/1991 | Watanabe et al. | 357/42 |

FOREIGN PATENT DOCUMENTS 0133131 2/1985 European Pat. Off. .
59-112642 6/1984 Japan .
59-177945 10/1984 Japan .

OTHER PUBLICATIONS

IBM Technical Disclosure Bulletin, vol. 19, No. 11, Apr. 1977 pp. 4191–4192.

IEEE Journal of Solid-State Circuits vol. 8, No. 1 Feb. 1990, pp. 142–148.

T. Hanibuchi, et al., "A Bipolar-PMOS Merged Basic Cell for 0.8μm BiCMOS Sea-of-Gates", IEEE 1990, Custom Integrated Circuits Conference, pp. 4.2.1–4.2.4.

H. Momose, et al., "Characterization of Speed and Stability of BiNMOS Gates with a Bipolar and PMOSFET Merged Structure", IEEE, 1990, pp. 9.6.1–9.6.4.

*Primary Examiner*—Mark V. Prenty
*Attorney, Agent, or Firm*—Foley & Lardner

[57] ABSTRACT

A semiconductor device has a plurality of basic cells fabricated on a single semiconductor substrate. Each of the basic cells comprises a first-conduction-type FETs, a second-conduction-type FETs, and a bipolar transistor. The collector region of the bipolar transistor is formed in a well region where the first-conduction-type FETs are formed. The bipolar transistor is formed between the first-conduction-type FETs of adjacent ones of the basic cells separated by an element insulation film.

14 Claims, 7 Drawing Sheets

SEMICONDUCTOR DEVICE

This application is a continuation of application Ser. No. 07/989,905, filed Dec. 11, 1992 now abandoned, which is a continuation application of prior application Ser. No. 07/729,559, filed on Jul. 15, 1991 now abandoned.

BACKGROUND OF THE INVENTION

1. Field of the Invention

The present invention relates to a semiconductor device in which bipolar transistors and FETs (field effect transistors) are merged to form basic cells.

2. Description of the Prior Art

Figure 1:
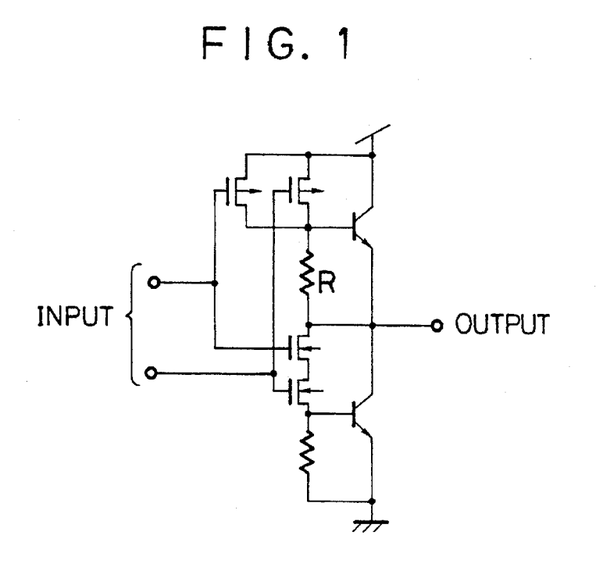
FIG. 1 is a circuit diagram showing a basic cell of a conventional BiCMOS logic circuit.

FIG. 1 shows a conventional BiCMOS logic circuit having a totem-pole output buffer for compensating the low driving capacity of a CMOS circuit.

This arrangement involves a long output delay time, because MOS transistors to be used for the arrangement have been integrated in recent years, and therefore, the power source voltage of the MOS transistors is too low to increase the power source voltage dependency of the output delay time.

To deal with this problem, BiNMOS and BiRNMOS logic circuits each employing n-channel MOS transistors (hereinafter referred to as the NMOS transistors) instead of a bipolar transistor on the grounding side of an output stage of the circuit are frequently used for semiconductor integrated circuits fabricated according to a design rule of about 0.5 micrometers.

Figure 2:
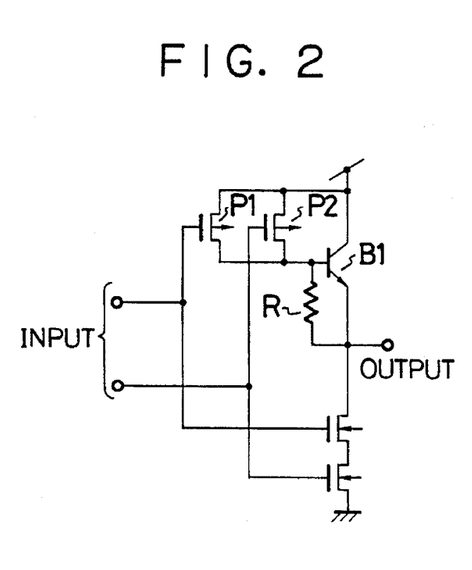
FIG. 2 is a circuit diagram showing a basic cell of a conventional BiNMOS logic circuit.
Figure 3:
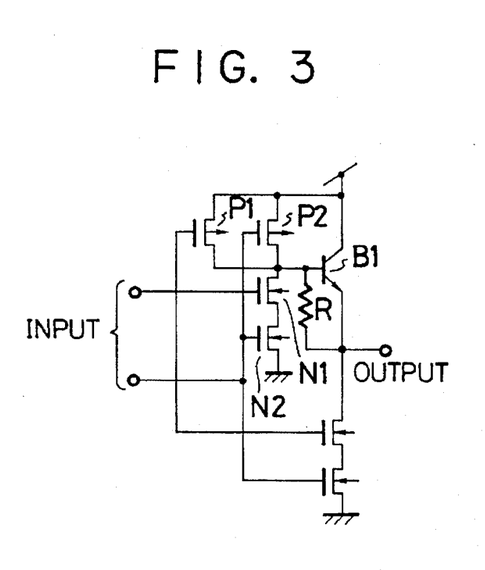
FIG. 3 is a circuit diagram showing a basic cell of a conventional BiRNMOS logic circuit.

FIG. 2 shows a 2-input NAND gate as an example of the BiNMOS logic circuits, and FIG. 3 shows a 2-input NAND gate as an example of the BiRNMOS logic circuits. The BiRNMOS circuit of FIG. 3 has, in addition to the BiNMOS circuit of FIG. 2, NMOS transistors N1 and N2 for improving the speed of discharging the base charges of an NPN bipolar transistor B1 through a resistance R.

This BiNMOS or BiRNMOS circuit employs only one bipolar transistor B1 whose collector potential is always at a power source potential as shown in FIGS. 2 and 3.

When the BiNMOS circuit is used as an internal gate circuit of a gate array whose cells are identically arranged in a process before a wiring process, a collector region of the output NPN bipolar transistor B1 can be formed in an n-type well region where p-channel MOS transistors (hereinafter referred to as the PMOS transistors) P1 and P2 are formed.

An example of this kind of arrangement is disclosed in, for example, Japanese Laid-Open Patent No. 59-177945. This disclosure simply teaches arranging an output NPN bipolar transistor and PMOS transistors in the same n-type well region. This arrangement involves, therefore, an increased circuit area compared with a CMOS gate array that employs MOS transistors only. The disclosure, therefore, hardly realizes high integration of semiconductor devices.

Figure 4:
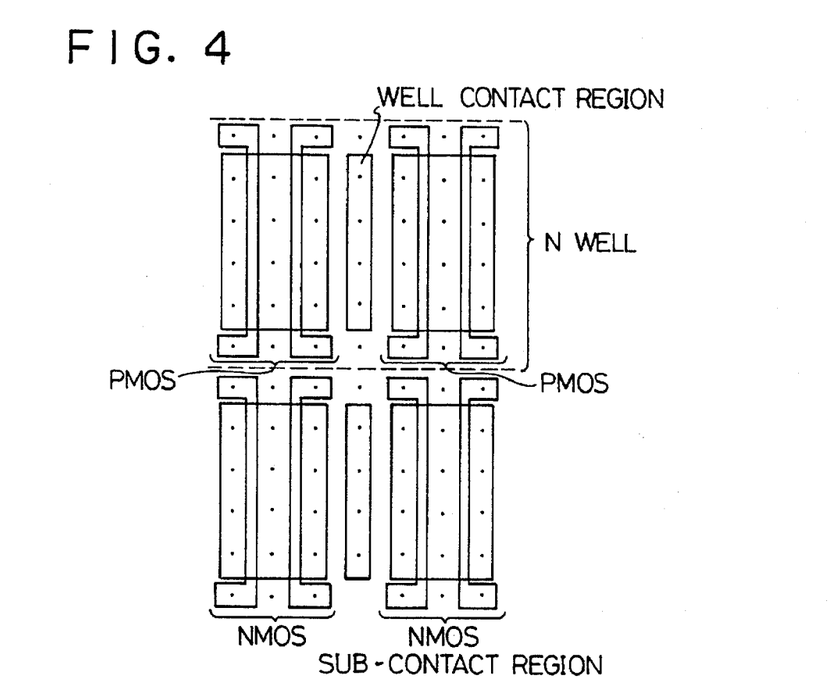
FIG. 4 is a layout showing a basic cell of a conventional CMOS logic circuit.
Figure 5:
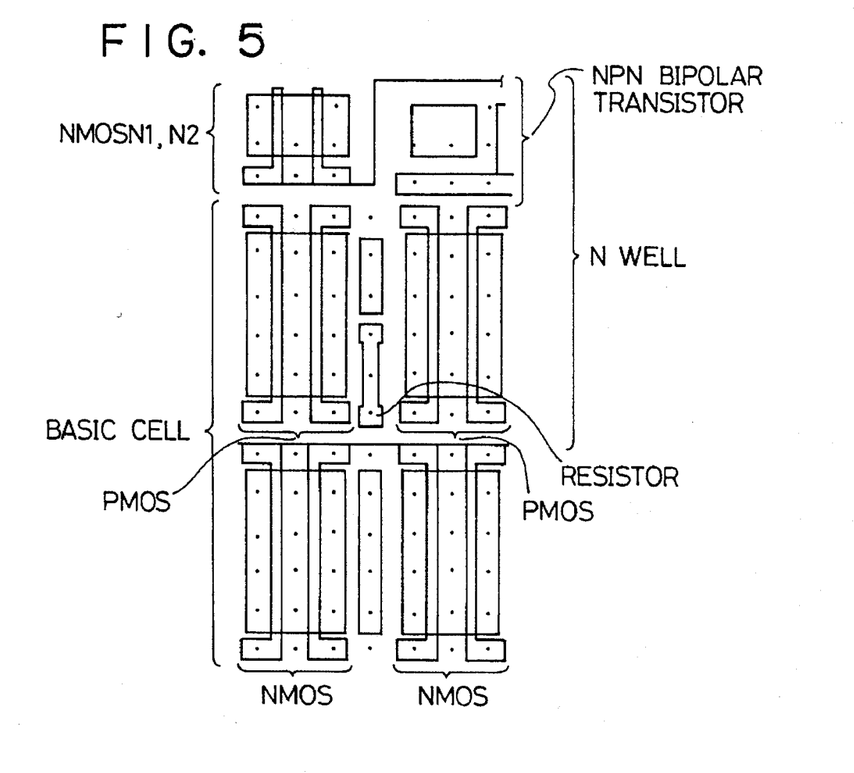
FIG. 5 is a layout showing a basic cell of a conventional BiCMOS logic circuit.

FIG. 4 is a layout showing a basic cell of the CMOS gate array, and FIG. 5 is a layout showing a cell of a logic gate that has been designed to make full use of the layout of FIG. 4. In FIG. 5, an NPN bipolar transistor is disposed on the longitudinal side of the basic cell region. This layout increases a cell area approximately 25% more than that of FIG. 4.

Figure 6A:
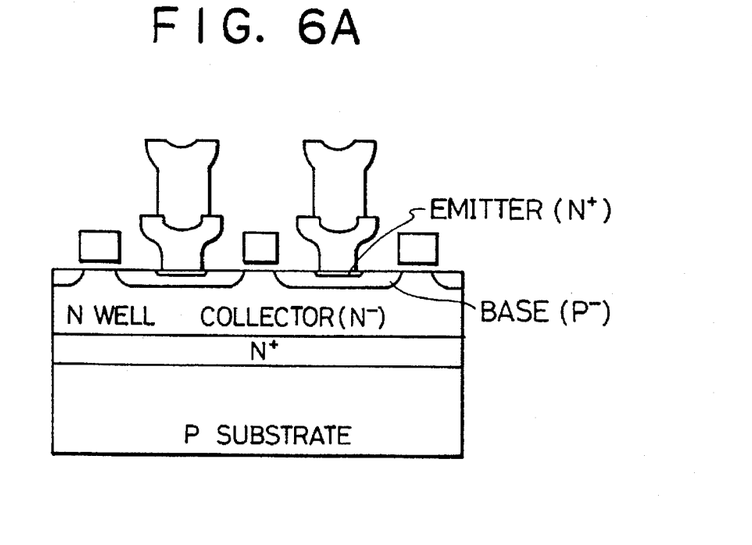
FIGS. 6A and 6B are sectional and plan views, respectively, showing a basic cell of a conventional BiCMOS logic circuit.
Figure 6B:
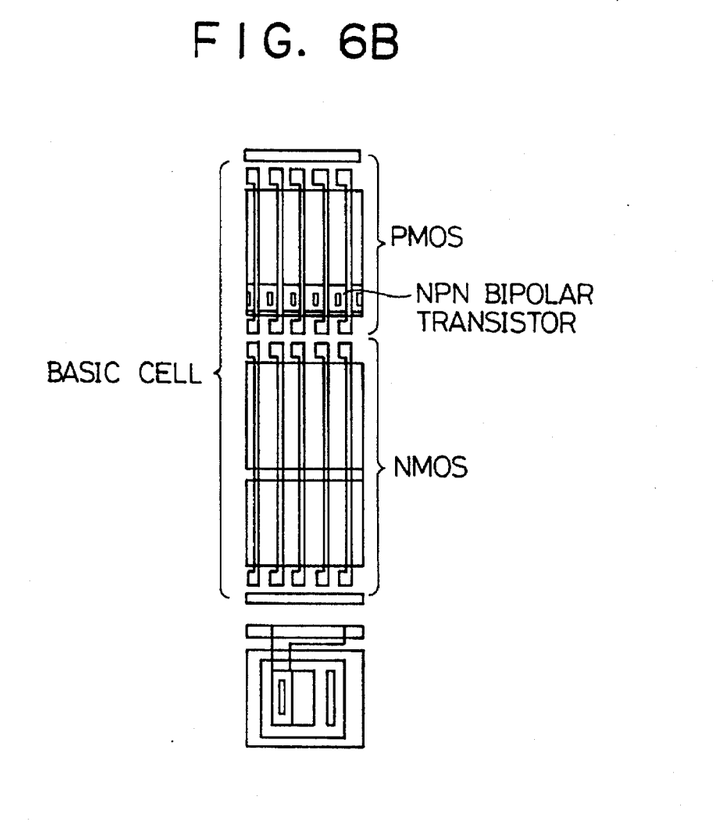

FIGS. 6A and 6B are sectional and plan views showing another example of the conventional logic gates, in which an NPN bipolar transistor is merged in the source or drain region of a PMOS transistor of a basic cell of a CMOS gate array. In this arrangement, the base region of the NPN bipolar transistor and the source or drain region of the PMOS transistor will be formed in the same diffusion layer.

An impurity concentration of the base region of the bipolar transistor must be lower than that of the source of drain region of the PMOS transistor. If this low impurity concentration of the base region of the bipolar transistor is applied to form a p-type diffusion layer in which the source or drain region of the PMOS transistor is also to be formed, the arrangement of FIGS. 6A and 6B will deteriorate the properties of the PMOS transistor and thus those of the CMOS circuit.

SUMMARY OF THE INVENTION

To solve these problems of the conventional techniques, an object of the invention is to provide a semiconductor device involving a BiCMOS circuit with basic cells each occupying substantially the same area as that occupied by a basic cell of a CMOS gate array. This device realizes the compactness without deteriorating its properties.

In order to accomplish the object, a semiconductor device according to the invention has a plurality of basic cells fabricated on a single semiconductor substrate. Each of the basic cells includes first-conduction-type FETs, second-conduction-type FETs, and a bipolar transistor. The semiconductor device is characterized in that a collector region of the bipolar transistor is formed in a well region where the first-conduction-type FETs are formed, and that the bipolar transistor is formed between the first-conduction-type FETs of adjacent ones of the basic cells separated by an element insulation film.

The area of each basic cell of the BiCMOS circuit of the invention is substantially equal to that of a basic cell of a CMOS gate array. This arrangement, therefore, contributes to high integration of semiconductor devices.

DETAILED DESCRIPTION OF THE EMBODIMENTS

The embodiments of the invention will be explained with reference to the drawings.

Figure 7:
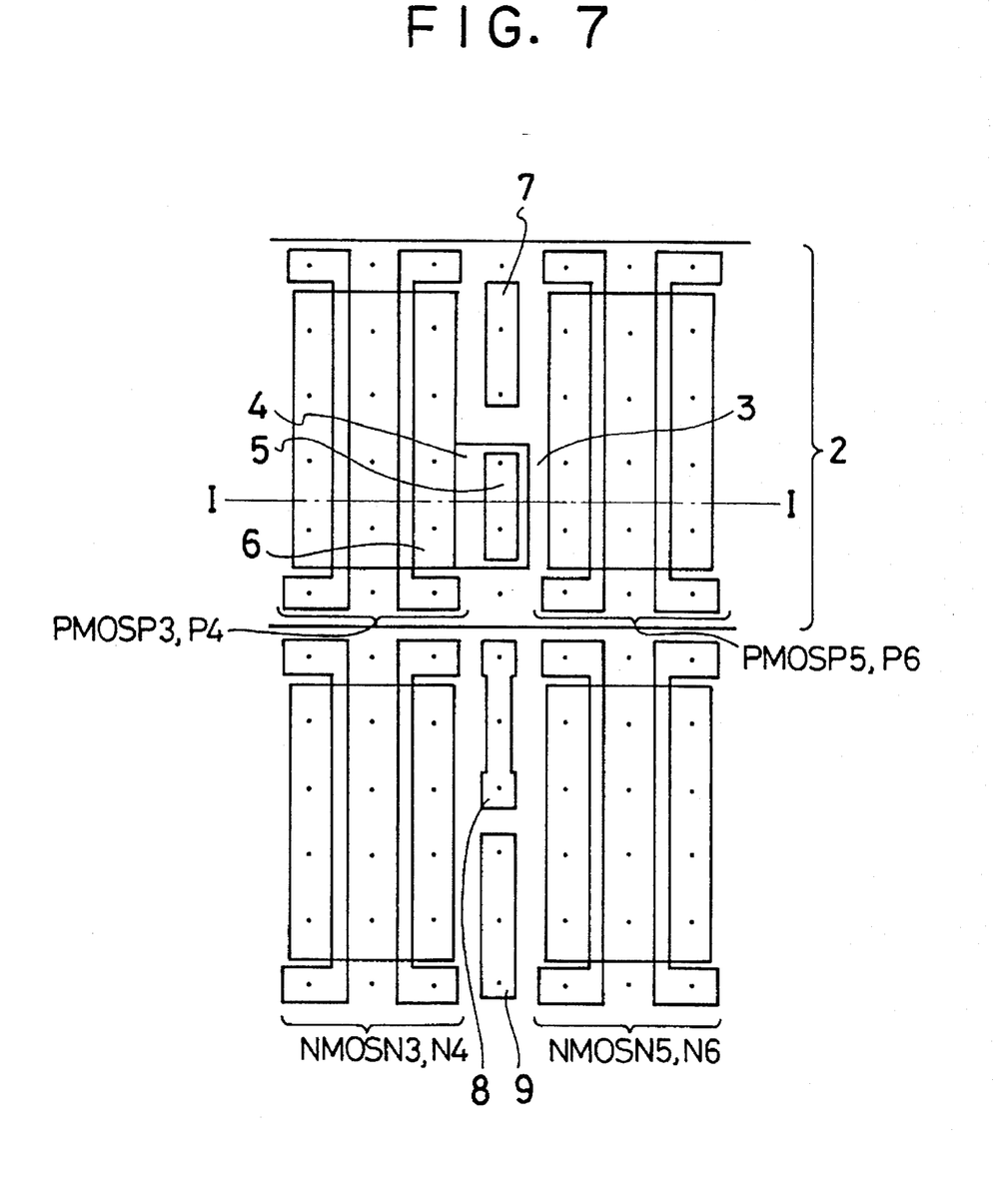
FIG. 7 is a layout showing a basic cell of a BiNMOS logic circuit according to an embodiment of the invention.
Figure 8:
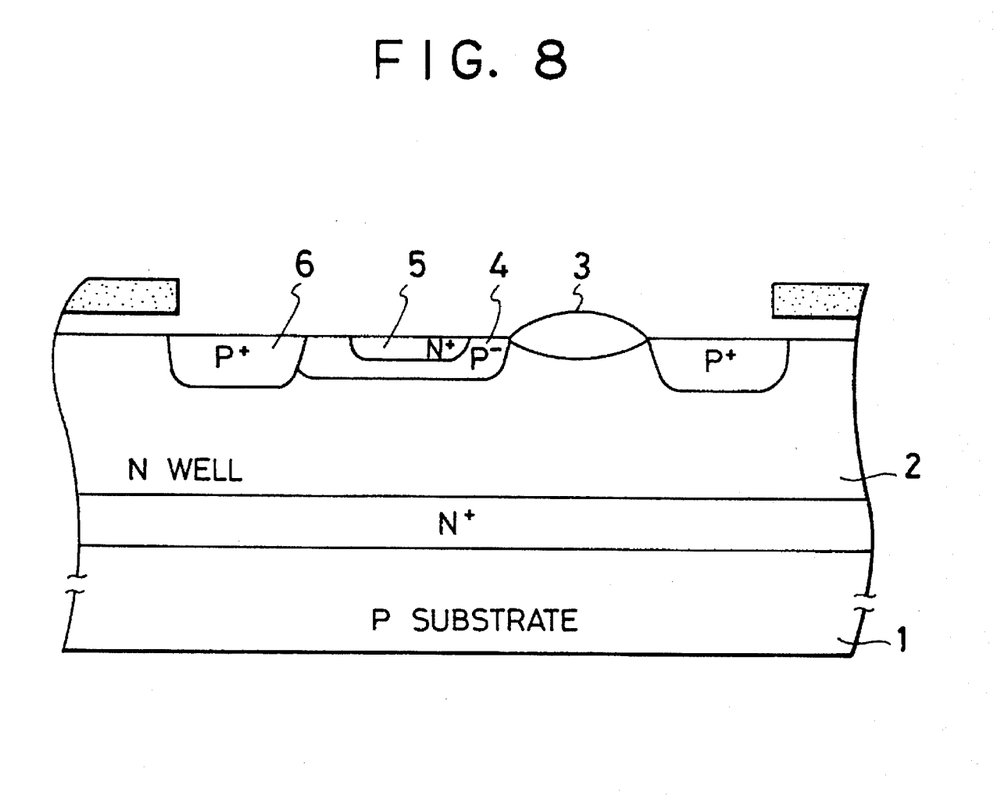
FIG. 8 is a sectional view showing the basic cell of the BiNMOS logic circuit of the embodiment.

FIG. 7 is a layout showing a basic cell of a semiconductor device according to an embodiment of the invention, and FIG. 8 is a sectional view taken along a line I—I of FIG. 7. The embodiment of FIG. 7 relates to a BiNMOS circuit of a BiCMOS gate array formed on the basic cell of the CMOS gate array shown in FIG. 5.

In FIG. 7, a p-type semiconductor substrate 1 includes an n-type well region 2 in which pairs of PMOS transistors P3 and P4, and P5 and P6 are formed. Pairs of NMOS transistors N3 and N4, and N5 and N6 corresponding to the PMOS transistor pairs are formed on the longitudinal side of the PMOS transistors P3 to P6. In the BiCMOS gate array, the PMOS transistor pair P3 and P4 and the PMOS transistor pair P5 and P6 belong to different basic cells, respectively. These pairs are electrically separated from each other by an element insulation film 3 such as an oxide film. The NMOS transistors N3 and N4 are similarly separated from the NMOS transistors N5 and N6. The PMOS transistors P3 and P4 and NMOS transistors N3 and N4 belong to the same basic cell, while the PMOS transistors P5 and P6 and NMOS transistors N5 and N6 belong to another same basic cell.

An NPN bipolar transistor is formed in the n-type well region 2 between the PMOS transistor pairs P3 and P4, and P5 and P6. This bipolar transistor comprises a collector region that is equal to the n-type well region 2, a p—-type base region 4 formed in the n-type well region 2, and an n+-type emitter region 5 formed in the p—-type base region 4. The p—-type base region 4 of the p—-type bipolar transistor is joined with a p+-type diffusion layer region 6 serving as the source or drain of the PMOS transistor P4.

A well contact 7 is formed in the n-type well region 2 between the PMOS transistor pairs P3 and P4, and P5 and P6 so that the well region 2 may have a power source potential. The well contact 7 also serves as the collector electrode of the bipolar transistor. The n-type well region 2 serving as the collector region of the bipolar transistor is connected to a power source through the well contact 7 and wiring.

A resistance 8 made of, for example, an n—-type diffusion layer or polycrystalline silicon is formed between the NMOS transistor pairs N3 and N4, and N5 and N6. A sub-contact 9 for setting the substrate 1 to a ground potential is formed in the vicinity of the resistance 8.

The PMOS transistors P3 and P4, NMOS transistors N3 and N4, bipolar transistor, and resistance 8 are wired to constitute the BiNMOS basic cell of FIG. 3.

Compared with the layout of FIG. 4 showing the basic cell of the CMOS gate array, the layout of FIG. 7 of the invention has the base region 4 and emitter region 5 of the NPN bipolar transistor in a part of the well contact region of the CMOS circuit, and the resistance 8 in a part of the sub-contact region of the CMOS circuit.

The area of each basic cell of the invention is, therefore, remarkably smaller than the cell area of the conventional BiCMOS gate array in which the bipolar transistor is simply arranged on the longitudinal side of the basic cell of the CMOS gate array. Namely, the invention can form the basic cell of the BiCMOS gate array with substantially the same area as the basic cell of the CMOS gate array.

In addition, according to the invention, the diffusion layer region serving as the source or drain region of the PMOS transistor and the base region of the bipolar transistor can be separately formed each at an optimum impurity concentration, so that no deterioration may occur in the properties of the transistors.

Figure 9:
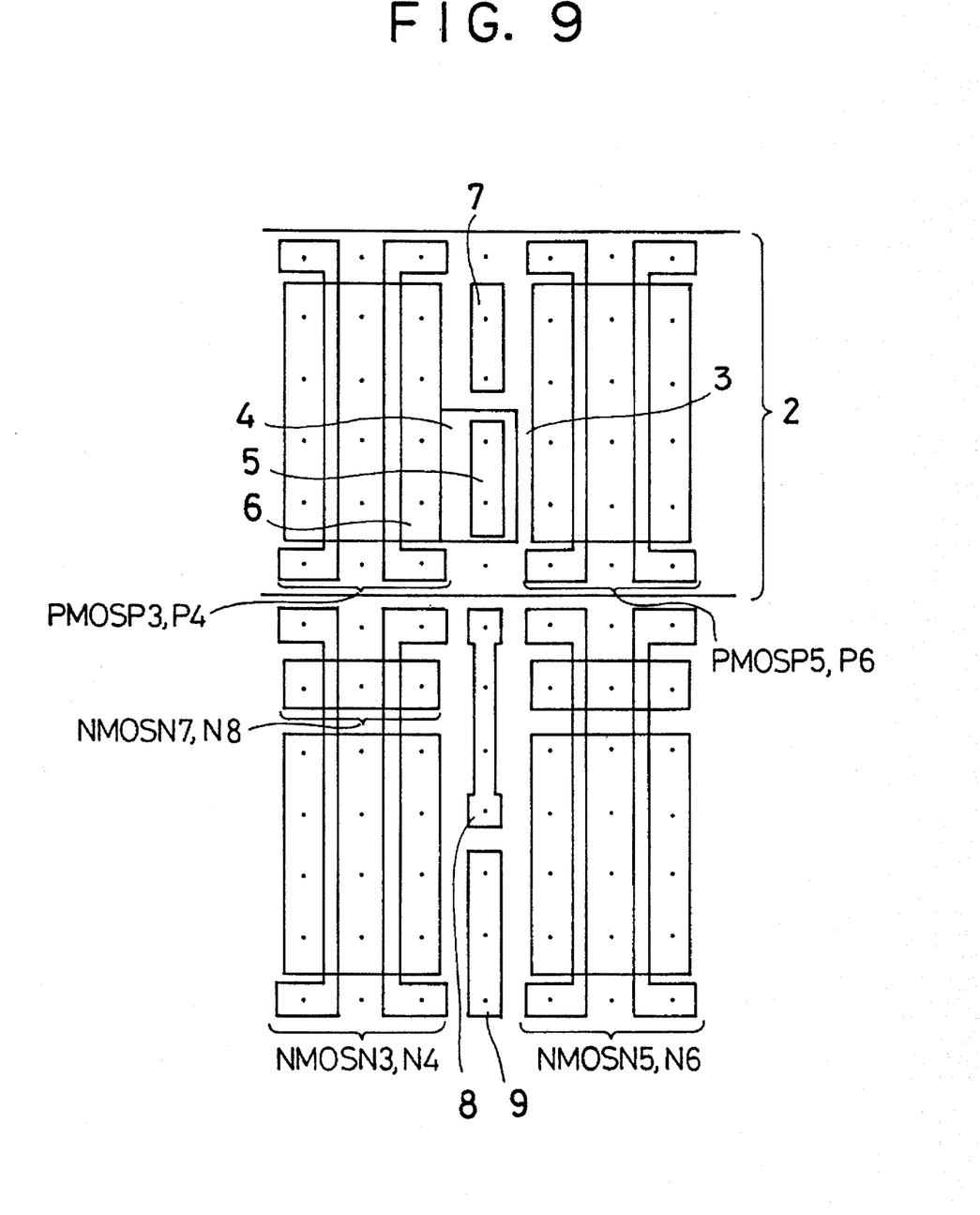
FIG. 9 is a layout showing a basic cell of a BiNMOS logic circuit according to another embodiment of the invention.

FIG. 9 is a layout showing another embodiment of the invention. In the figure, the BiRNMOS circuit of FIG. 3 is similarly formed on the basic cell of the CMOS gate array. In FIG. 9, the same reference marks as in FIG. 7 represent like parts, and therefore, the explanations thereof will be omitted.

Similar to the previous embodiment, a bipolar transistor is formed between adjacent PMOS transistors that belong to different basic cells. NMOS transistors N7 and N8 for discharging the base of the bipolar transistor are arranged adjacent to and on the longitudinal side of NMOS transistors N3 and N4.

Each basic cell of this layout occupies an area about 8% larger than that occupied by the basic cell of the CMOS gate array. In this way, this embodiment can realize a BiCMOS gate array involving BiRNMOS circuits without greatly increasing its area compared with the CMOS gate array.

Figure 10:
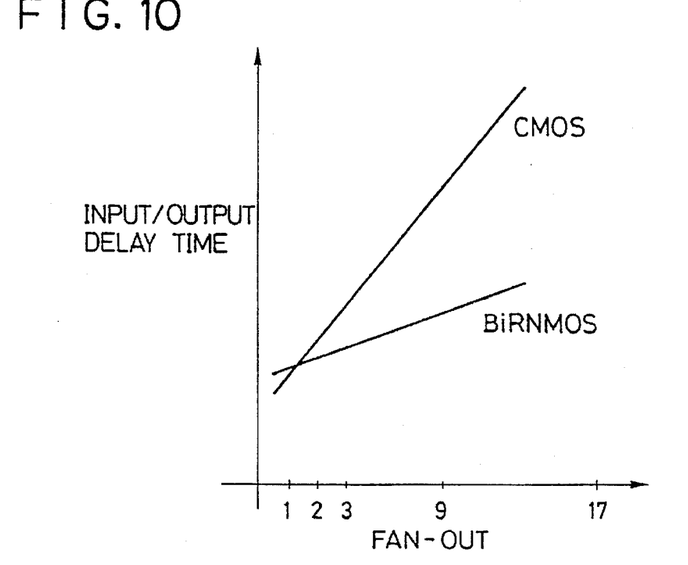
FIG. 10 is a comparison diagram of the input/output delay time and fan-out of basic cells of a BiNMOS logic circuit and CMOS logic circuit.

FIG. 10 shows a relationship between input/output delay time and fan-out of a CMOS basic cell and of a BiRNMOS basic cell. As is apparent in the figure, the response speed of the CMOS basic cell is faster than that of the BiRNMOS basic cell at around a fan-out of 1, but the BiRNMOS basic cell becomes faster than the CMOS basic cell at around a fan-out 2 and thereafter.

To actually constitute a required circuit with the BiCMOS gate array, the CMOS basic cells are used for a part where load is small, and BiRNMOS basic cells for a part where load is large. In this way, both types of the basic cells can be used in a single gate array.

Figure 11:
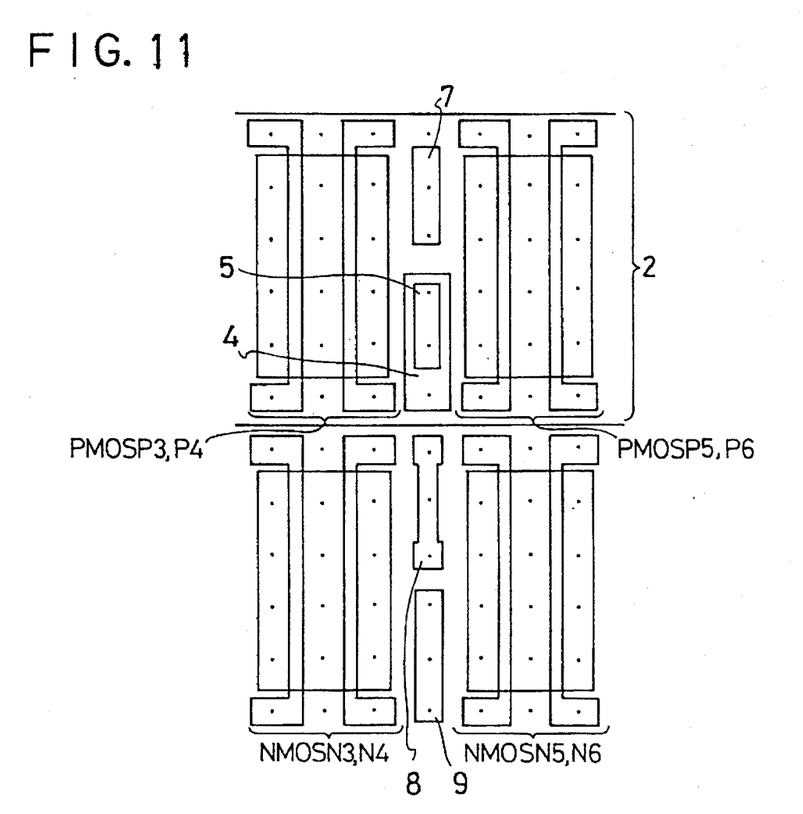
FIG. 11 is a layout showing a basic cell of a BiNMOS logic circuit according to still another embodiment of the invention.

If the base region of a bipolar transistor is joined to each of the diffusion layer regions of PMOS transistors that are arranged on each side of the base region of the bipolar transistor and belonging to different basic cells, the use of one of the diffusion layer regions of the PMOS transistors restricts the use of the other. It is preferable, therefore, to isolate the base region of the bipolar transistor from one of the diffusion layer regions of the PMOS transistors that belong to the different basic cells separated from each other with an element insulation region. The base region of the bipolar transistor may be isolated from each of the diffusion regions of the PMOS transistors disposed on each side of the base region, as shown in FIG. 11.

As explained above, the invention arranges a bipolar transistor as an element of a basic cell in a region that separates FETs belonging to different basic cells from each other. This arrangement can reduce the area of each basic cell in a BiCMOS circuit, compared with conventional circuits, without deteriorating the properties of the transistors.

Namely, each basic cell of the BiCMOS circuit of the invention occupies substantially the same area as that occupied by a basic cell of a CMOS gate array. The invention thus contributes to high integration of semiconductor devices.

What is claimed is:

1. A semiconductor device having a plurality of basic cells, a semiconductor substrate of a first conductivity type, and a well region of a second conductivity type, each of said basic cells comprising:

a first pair of first conductivity-type field effect transistors, having one of a source and a drain region of said first conductivity type in said well region of said second conductivity type, said first pair of first conductivity-type field effect transistors being formed adjacent to each other;

a second pair of first conductivity-type field effect transistors, having one of a source and a drain region of said first conductivity type in said well region of said second conductivity type, said second pair of first conductivity-type field effect transistors being formed adjacent to each other and formed next to said first pair of first conductivity-type field effect transistors in a first direction;

a first pair of second conductivity-type field effect transistors, having one of a source and a drain region of said second conductivity type in said semiconductor substrate of said first conductivity type, said first pair of second conductivity-type field effect transistors being formed adjacent to each other, and aligned next to said first pair of first conductivity-type field effect transistors in a second direction perpendicular to said first direction;

a second pair of second conductivity-type field effect transistors, having one of a source and a drain region of said second conductivity type in said semiconductor substrate of said first conductivity type, said second pair of second conductivity-type field effect transistors being formed adjacent to each other, and formed next to said first pair of second conductivity-type field effect transistors in said first direction;

a third pair of second conductivity-type field effect transistors, having one of a source and a drain region of said second conductivity type in said semiconductor substrate of said first conductivity type, said third pair of second conductivity-type field effect transistors being formed adjacent to each other, and formed aligned next to said first pair of first conductivity-type field effect transistors and to said first pair of second conductivity-type field effect transistors in a second direction perpendicular to said first direction;

a bipolar transistor formed between said first pair of first conductivity-type field effect transistors and said second pair of first conductivity-type field effect transistors and having a base region of said first conductivity type formed in said well region, a portion of said well region of said second conductivity type as a collector region, and an emitter region of said second conductivity type formed in said base region;

a well contact region formed between said first pair of first conductivity-type field effect transistors and said second pair of first conductivity-type field effect transistors and located adjacent to said bipolar transistor in said second direction such that a first region between said first pair of first conductivity-type field effect transistors and said second pair of first conductivity-type field effect transistors is shared by said well contact region and said bipolar transistor;

a resistance formed between said first pair of second conductivity-type field effect transistors and said second pair of second conductivity-type field effect transistors;

a sub-contact region formed between said first pair of second conductivity-type field effect transistors and said second pair of second conductivity-type field effect transistors and located adjacent to said resistance in said second direction such that a second region between said first pair of second conductivity-type field effect transistors and said second pair of second conductivity-type field effect transistors is shared by said resistance and said sub-contact region;

element insulation means disposed between the one of the source and the drain region of said first pair of first conductivity-type field effect transistors and the one of the source and the drain region of said second pair of first conductivity-type field effect transistors, for isolating electrically said first pair of first conductivity-type field effect transistors from said second pair of first conductivity-type field effect transistors, wherein the one of the source and the drain region of one of said first pair of first conductivity-type field effect transistors is connected to said base region of said bipolar transistor, wherein said bipolar transistor is formed adjacent to said element insulation means, said element isolation means being located between said bipolar transistor and said second pair of first conductivity-type field effect transistors, wherein the base region of said bipolar transistor has a lower impurity concentration than the one of the source and the drain region of one of said first pair of first conductivity-type field effect transistors, and wherein said well contact region also serves as a collector electrode of said bipolar transistor.

2. The semiconductor device according to claim 1, wherein said base region of said bipolar transistor is joined to the source or drain region of said first pair of first conductivity-type field effect transistors.

3. The semiconductor device according to claim 1, wherein each of said basic cells has a resistance which is formed between said first pair of second conductivity-type field effect transistors and said second pair of second conductivity-type field effect transistors.

4. A semiconductor device according to claim 1, further comprising an N-channel region of said device formation region formed on a semiconductor substrate, wherein said first pair and said second pair of second conductivity-type field effect transistors are formed on said N-channel region, a first contact region is formed between said first pair and said second pair of first conductivity-type field effect transistors for holding a P-channel region at a first electrical potential, and a second contact region is formed between said first pair and said second pair of second conductivity-type field effect transistors for holding said N-channel region at a second electrical potential.

5. The semiconductor device according to claim 4, wherein said bipolar transistor, said first and said second conductivity-type contact regions, and said resistance is formed along a straight line in said second direction.

6. A semiconductor device having a plurality of basic cells fabricated on a device formation region formed on a semiconductor substrate in a same column of a grid, each of said basic cells comprising:

a first pair of first conductivity-type field effect transistors formed adjacently to each other on a P-channel region of said device formation region;

a second pair of first conductivity-type field effect transistors formed adjacently to each other on said P-channel region, and formed next to said first pair of first conductivity-type field effect transistors in a first direction;

a first pair of second conductivity-type field effect transistors formed adjacently to each other, and aligned next to said first pair of first conductivity-type field effect transistors in a second direction;

a second pair of second conductivity-type field effect transistors formed adjacently to each other, and formed next to said first pair of second conductivity-type field effect transistors in said first direction;

a third pair of second conductivity-type field effect transistors formed adjacently to each other, and aligned next to said first pair of first conductivity-type field effect transistors and to said first pair of second conductivity-type field effect transistors in a second direction;

a bipolar transistor formed between said first pair of first conductivity-type field effect transistors and said second pair of first conductivity-type field effect transistors;

a well contact region formed between said first pair of first conductivity-type field effect transistors and said second pair of first conductivity-type field effect transistors and located adjacent to said bipolar transistor in said second direction such that a first region between said first pair of first conductivity-type field effect transistors and said second pair of first conductivity-type field effect transistors is shared by said well contact region and said bipolar transistor;

a resistance formed between said first pair of second conductivity-type field effect transistors and said second pair of second conductivity-type field effect transistors;

a sub-contact region formed between said first pair of second conductivity-type field effect transistors and said second pair of second conductivity-type field effect transistors and located adjacent to said resistance in said second direction such that a second region between said first pair of second conductivity-type field effect transistors and said second pair of second conductivity-type field effect transistors is shared by said resistance and said sub-contact region;

element insulation means disposed between said first pair of first conductivity-type field effect transistors and said second pair of first conductivity-type field effect transistors on said P-channel region, for isolating electrically said first pair of first conductivity-type field effect transistors from said second pair of first conductivity-type field effect transistors, wherein a source or a drain region of one of said first pair of first conductivity-type field effect transistors is formed in a same diffusion layer as a base region of said bipolar transistor, wherein said bipolar transistor is formed adjacent to said element insulation means, said bipolar transistor further being isolated electrically from said second pair of first conductivity-type field effect transistors, wherein an impurity concentration of said base region of said bipolar transistor is lower than an impurity concentration of a source region or a drain region of said one of said first pair of first conductivity-type field effect transistors, and wherein said well contact region also serves as a collector electrode of said bipolar transistor.

7. A semiconductor device having a plurality of basic cells fabricated on a device formation region formed on a semiconductor substrate in a same column of a grid, each of said basic cells comprising:

a well region of a first conductivity type formed on said semiconductor substrate;

a first pair of second conductivity-type field effect transistors formed adjacent to each other, said first pair of second conductivity-type field effect transistors having a first diffusion layer region of said second conductivity type formed in said well region of said first conductivity type, wherein said first diffusion layer region operates as one of a source and a drain of said first pair for second conductivity-type field effect transistors;

a second pair of second conductivity-type field effect transistors formed adjacent to each other and formed next to said first pair of second conductivity-type field effect transistors in a first direction, said second pair of second conductivity-type field effect transistors having a second diffusion layer region of said second conductivity type formed in said well region of said first conductivity type, wherein said second diffusion layer region operates as one of a source and a drain for said second pair of second conductivity-type field effect transistors;

a third pair of second conductivity-type field effect transistors formed adjacent to each other, said third pair of second conductivity-type field effect transistors having a third diffusion layer region of said second conductivity type formed in said well region of said first conductivity type, wherein said third diffusion layer region operates as one of a source and a drain of said first pair of second conductivity-type field effect transistors;

a first pair of first conductivity-type field effect transistors formed adjacent to each other, and formed next to said first pair of first conductivity-type field effect transistors in a second direction;

a second pair of first conductivity-type field effect transistors formed adjacent to each other, and formed next to said first pair of second conductivity-type field effect transistors in said first direction;

a bipolar transistor formed between said first pair of second conductivity-type field effect transistors and said second pair of second conductivity-type field effect transistors, said bipolar transistor including, a base region of said second conductivity type formed adjacent to and contiguous with said first diffusion layer region of said second conductivity type, an impurity concentration of said base region being lower than an impurity concentration of said first diffusion layer region, an emitter region of said first conductivity type formed in said base region, and a collector region formed as part of said well region; and a well contact region formed between said first pair of first conductivity-type field effect transistors and said second pair of first conductivity-type field effect transistors and located adjacent to said bipolar transistor in said second direction such that a first region between said first pair of first conductivity-type field effect transistors and said second pair of first conductivity-type field effect transistors is shared by said well contact region and said bipolar transistor;

a resistance formed between said first pair of second conductivity-type field effect transistors and said second pair of second conductivity-type field effect transistors;

a sub-contact region formed between said first pair of second conductivity-type field effect transistors and said second pair of second conductivity-type field effect transistors and located adjacent to said resistance in said second direction such that a second region between said first pair of second conductivity-type field effect transistors and said second pair of second conductivity-type field effect transistors is shared by said resistance and said sub-contact region;

element insulation means disposed between said base region of said bipolar transistor and said second pair of second conductivity-type field effect transistors, for isolating electrically said second pair of second conductivity-type field effect transistors from said second pair of second conductivity-type field effect transistors, wherein said well contact region also serves as a collector electrode of said bipolar transistor.

8. The semiconductor device according to claim 7, further comprising:

an electrode disposed on a top surface of said well region, wherein said electrode operates as a collector electrode of said bipolar transistor.

9. The semiconductor device according to claim 7, wherein said first diffusion layer region is contiguous with one side of said base region of said bipolar transistor, and said element insulation means is contiguous with a second side of said base region opposite said first side.

10. The semiconductor device according to claim 1, wherein said resistance is formed from one of an n—-type diffusion layer and polycrystalline silicon.

11. The semiconductor device according to claim 10, further comprising a power source, wherein said collector region of said bipolar transistor is connected to said power source through said well contact region.

12. The semiconductor device according to claim 11, wherein said third pair of second conductivity-type field effect transistors are formed between said first pair of first conductivity-type field effect transistors and said first pair of second conductivity-type field effect transistors in said second direction.

13. The semiconductor device according to claim 9, wherein said second diffusion layer is contiguous with one side of said element insulation means, and said base region of said bipolar transistor is contiguous with another side of said element insulation means, said one side being opposite to said another side.

14. The semiconductor device according to claim 7, wherein said second pair of first conductivity-type field effect transistors are disposed along a first direction with respect to said first pair of first conductivity-type field effect transistors, and wherein said first pair of second conductivity-type field effect transistors and said third pair of second conductivity-type field effect transistors are disposed along a second direction with respect to said first pair of first conductivity-type field effect transistors, said second direction being perpendicular to said first direction.

* * * * *